(12) United States Patent
Huot et al.

(10) Patent No.: US 8,731,492 B2
(45) Date of Patent: May 20, 2014

(54) SYSTEM FOR MONITORING AND CONTROLLING THE POWER OF A RADIO FREQUENCY (RF) SIGNAL IN A SHORT-RANGE RF TRANSMITTER

(75) Inventors: Alain Huot, Toulouse (FR); Christophe Pinatel, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 371 days.

(21) Appl. No.: 13/054,124

(22) PCT Filed: Jul. 17, 2008

(86) PCT No.: PCT/IB2008/054159
§ 371 (c)(1),
(2), (4) Date: Jan. 14, 2011

(87) PCT Pub. No.: WO2010/007475
PCT Pub. Date: Jan. 21, 2010

(65) Prior Publication Data
US 2011/0124303 A1    May 26, 2011

(51) Int. Cl.
*H04B 1/04* (2006.01)
*H04B 17/00* (2006.01)

(52) U.S. Cl.
USPC ..................... 455/115.1; 455/127.1

(58) Field of Classification Search
USPC ................ 455/115.1, 115.4, 127.2
See application file for complete search history.

(56) References Cited

U.S. PATENT DOCUMENTS

| | | | |
|---|---|---|---|
| 4,274,156 A | 6/1981 | Trefney | |
| 4,353,037 A * | 10/1982 | Miller | 330/298 |
| 4,373,206 A * | 2/1983 | Suzuki et al. | 455/103 |
| 5,307,512 A | 4/1994 | Mitzlaff | |
| 5,715,527 A | 2/1998 | Horii et al. | |
| 6,038,432 A * | 3/2000 | Onoda | 455/127.2 |
| 8,126,407 B2 * | 2/2012 | Jongsma et al. | 455/91 |
| 2003/0143963 A1 * | 7/2003 | Pistor et al. | 455/127 |
| 2005/0059362 A1 * | 3/2005 | Kalajo et al. | 455/127.1 |

FOREIGN PATENT DOCUMENTS

| | | |
|---|---|---|
| EP | 0110355 A | 6/1984 |
| EP | 1522428 A | 4/2005 |

OTHER PUBLICATIONS

International Search Report and Written Opinion correlating to PCT/IB2008/054159 dated Mar. 31, 2009.

* cited by examiner

*Primary Examiner* — Blane J Jackson

(57) ABSTRACT

A system for monitoring and controlling the power of a Radio Frequency (RF) signal in a short-range RF transmitter. An RF signal-generation unit generates the RF signal. A power amplifier amplifies the RF signal. An impedance-matching network matches the output impedance of the power amplifier to input impedance of an antenna. One or more RF power monitors monitor the voltage amplitude of the RF signal at the output of at least one of the RF signal-generation unit, the power amplifier and the impedance-matching network. The one or more RF power monitors further generate at least one alarm signal, based on the voltage amplitude of the RF signal. A control unit modifies at least one operating parameter of at least one of the RF signal-generation unit and the power amplifier, based on the at least one alarm signal generated by the one or more RF power monitors.

18 Claims, 5 Drawing Sheets

US 8,731,492 B2

SYSTEM FOR MONITORING AND CONTROLLING THE POWER OF A RADIO FREQUENCY (RF) SIGNAL IN A SHORT-RANGE RF TRANSMITTER

FIELD OF THE INVENTION

The present invention relates to the field of Radio Frequency (RF) transmission. More specifically, the present invention relates to a system for monitoring and controlling the power of an RF signal in a short-range RF transmitter.

BACKGROUND OF THE INVENTION

A short-range Radio Frequency (RF) transmitter comprises an RF signal-generation unit, a power amplifier, an impedance-matching network, a control unit and an antenna. The RF signal-generation unit generates an RF signal. The power amplifier amplifies the RF signal. The antenna radiates the amplified RF signal. The impedance-matching network matches the output impedance of the power amplifier to the input impedance of the antenna. The control unit controls the operations of the RF signal-generation unit and the power amplifier.

If one or more of the RF signal-generation unit, the power amplifier and the impedance-matching network has failed or malfunctioned, the power delivered to the antenna becomes very low. Consequently, the required RF power to ensure the radio link may not be radiated.

There already exists a system that solves this problem to some extent. The system detects faulty conditions, such as low transmitted power and high reflected power to rapidly switch off the power amplifier or turn on a backup transmitter. However, the system does not alert the control unit when the power amplifier or the RF signal-generation unit fails.

SUMMARY OF THE INVENTION

The present invention provides a system for monitoring and controlling the power of a Radio Frequency (RF) signal in a short range RF transmitter, a short range communication unit and a communication system as described in the accompanying claims Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings, in which like references indicate similar elements. Elements in the figures are illustrated for simplicity and clarity and have not necessarily been drawn to scale.

DETAILED DESCRIPTION OF THE PREFERRED EMBODIMENTS

Figure 1:
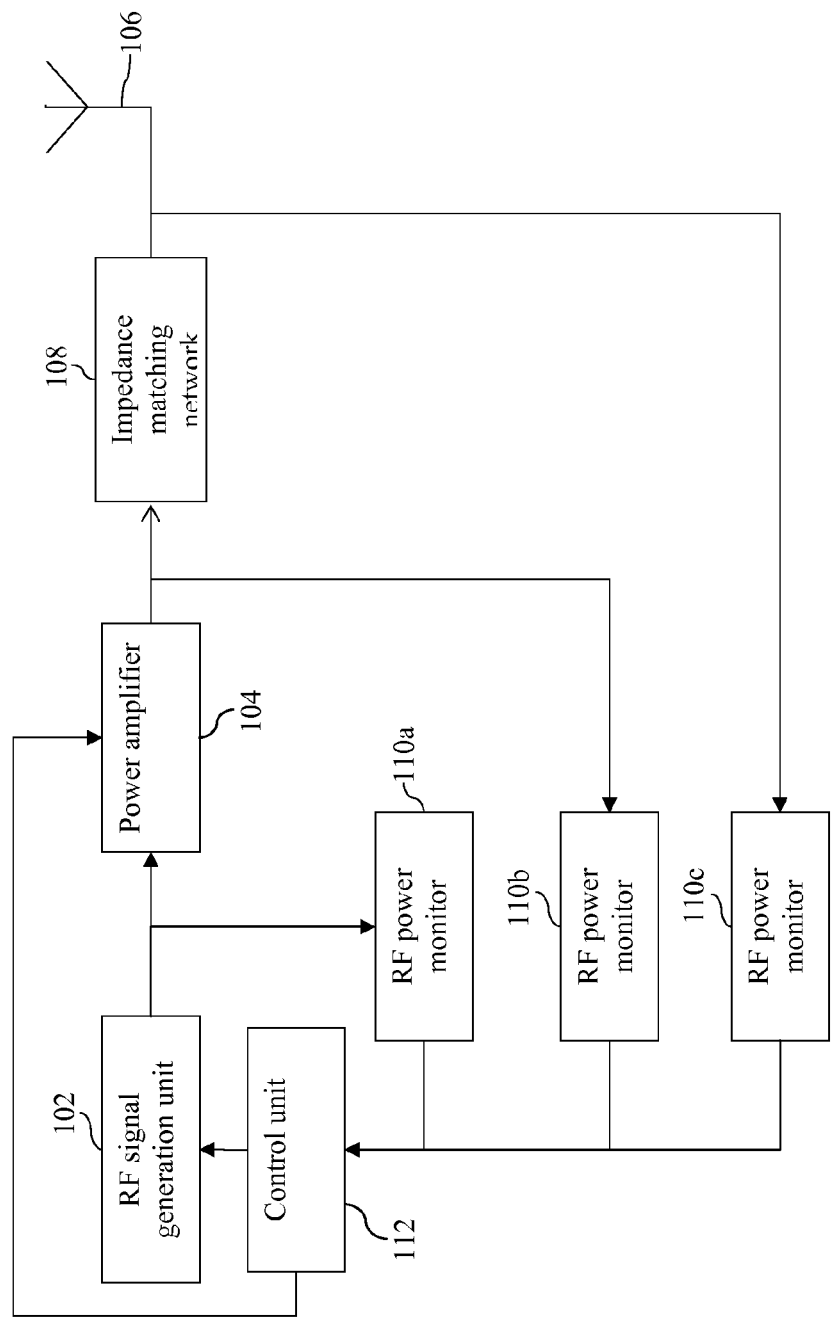
FIG. 1 schematically shows an example of a short-range Radio Frequency (RF) transmitter comprising a system for monitoring and controlling the power of an RF signal in a short-range RF transmitter.

FIG. 1 schematically shows a short-range Radio Frequency (RF) transmitter comprising a system for monitoring and controlling the power of an RF signal in a short-range RF transmitter. The short-range RF transmitter comprises an RF signal-generation unit 102, a power amplifier 104, an antenna 106, an impedance-matching network 108, one or more RF power monitors such as a power monitor 110a, a power monitor 110b and a power monitor 110c, and a control unit 112 such as microcontroller. Hereinafter, the control unit and the microcontroller are used interchangeably in the application.

In this example, the power amplifier 104 is connected to the output of RF signal-generation unit 102. Impedance-matching network 108 is connected between power amplifier 104 and antenna 106. The input of RF power monitor 110a is connected to the output of RF signal-generation unit 102. Similarly, the input of RF power monitor 110b is connected to the output of power amplifier 104. The input of RF power monitor 110c is connected to the output of impedance-matching network 108. The outputs of the one or more power monitors (110a, 110b and 110c) are connected to control unit 112. Further, control unit 112 is connected to RF signal-generation unit 102 and power amplifier 104.

The example illustrated in FIG. 1 may operated as follows. RF signal-generation unit 102 generates the RF signal. Power amplifier 104 amplifies the RF signal. Impedance-matching network 108 matches the output impedance of power amplifier 104 to the input impedance of antenna 106. Antenna 106 radiates the amplified RF signal. One or more RF power monitors (110a, 110b and 110c) monitor the voltage amplitude of the RF signal. Each of one or more RF power monitors (110a, 110b and 110c) compares the monitored voltage amplitude with one or more reference voltages such as an upper reference voltage and a lower reference voltage. When the monitored voltage amplitude reveals a failure condition, one or more power monitors (110a, 110b and 110c) generate at least one alarm signal, based on the comparison The at least one alarm signal is indicative of the one or more failures of at least one of RF signal-generation unit 102, power amplifier 104 and impedance-matching network 108. The one or more failure conditions may for example include the voltage amplitude of the RF signal being greater than the upper reference voltage or the voltage amplitude of the RF signal being less than the lower reference voltage.

It will be appreciated that the maximum power is transferred from a source to a load when the output impedance of the source is equal to the input impedance of the load.

Control unit 112 may modify one or more operating parameters of RF signal-generation unit 102 and power amplifier 104, based on the at least one alarm signal. The one or more operating parameters of RF signal-generation unit 102 may for example be the frequency and/or the amplitude of the RF signal. Whereas the operating parameters of power amplifier 104 may for example be the gain and the biasing conditions Thus, transmission of a Radio Frequency (RF) signal in a short-range RF transmitter in case of a faulty condition can be ensured and the power of the RF signal be monitored and adjusted if needed, For example, the voltage amplitude of the RF signal at the output of RF signal-generation unit 102 may reach a very high or a very low value due to a failure or a malfunction of RF signal-generation unit 102. RF power monitor 110a detects the voltage amplitude, compares it with the upper reference voltage and the lower reference voltage, and generates an alarm signal, based on the comparison. If the voltage amplitude is greater than the upper reference voltage, a "power too high" alarm signal is generated. If the voltage amplitude is less than the lower reference voltage, a "power too low" alarm signal is generated. Control unit 112 modifies the one or more operating parameters of RF signal-generation unit 102 or power amplifier 104 to reduce the power of the RF signal if the "power too high" alarm signal is received and increase the power of the RF signal if the "power too low" alarm signal is received.

Also, for example, the voltage amplitude of the RF signal at the output of power amplifier 104 may reach a very high or a very low value due to a failure or a malfunction of power amplifier 104. As described above, RF power monitor 110b generates a "power too high" alarm signal if the voltage amplitude is greater than the upper reference voltage and a "power too low" alarm signal if the voltage amplitude is less than the lower reference voltage. Control unit 112 modifies the one or more operating parameters of RF signal-generation unit 102 or power amplifier 104, based on the alarm signal received.

Furthermore, for example, the voltage amplitude of the RF signal at the output of impedance-matching network 108 may reach a very high or a very low value due to a failure or a malfunction of impedance-matching network 108. As described above, RF power monitor 110c generates a "power too high" alarm signal if the voltage amplitude is greater than the upper reference voltage, and a "power too low" alarm signal if the voltage amplitude is less than the lower reference voltage. Control unit 112 modifies the one or more operating parameters of RF signal-generation unit 102 or power amplifier 104, based on the alarm signal received.

Figure 2:
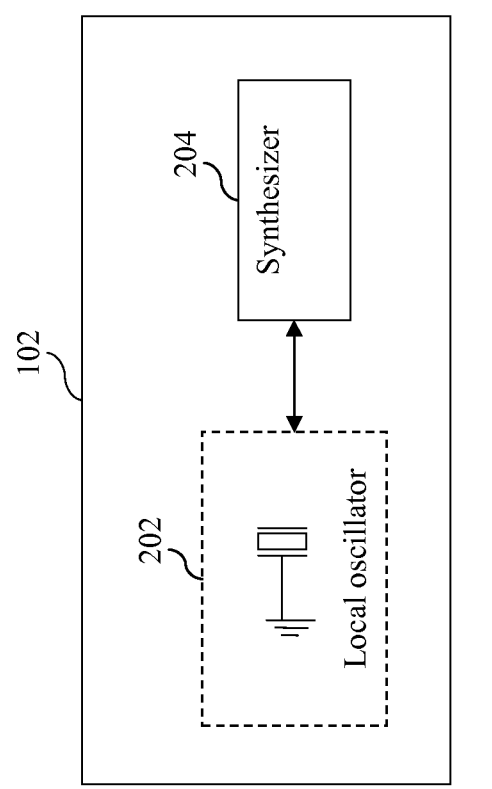
FIG. 2 schematically shows an example of an RF signal-generation unit.

FIG. 2 schematically shows an example of an RF signal-generation unit 102. RF signal-generation unit 102 comprises a local oscillator 202 and a synthesizer 204 connected to the output of local oscillator 202.

Local oscillator 202 generates an RF signal. Synthesizer 204 varies at least one of the amplitude and the frequency of the RF signal, based on the input received from control unit 112.

For example, when the voltage of the RF signal at the output of RF signal-generation unit 102 is greater than the upper reference voltage or less than the lower reference voltage, "power too high" alarm signal or "power too low" alarm signal is generated, respectively. RF power monitor 110a sends the alarm signal to control unit 112, indicating a faulty condition. In response to the signal, control unit 112 sends a command to synthesizer 204 for modifying one or more operating parameters such as the frequency and the amplitude of the RF signal. If "power too low" alarm signal is generated, synthesizer 204 increases the values of one or more operating parameters such as the frequency and the amplitude of the RF signal. If "power too high" alarm signal is generated, synthesizer 204 decreases the values of one or more operating parameters such as the frequency and the amplitude of the RF signal.

Figure 3:
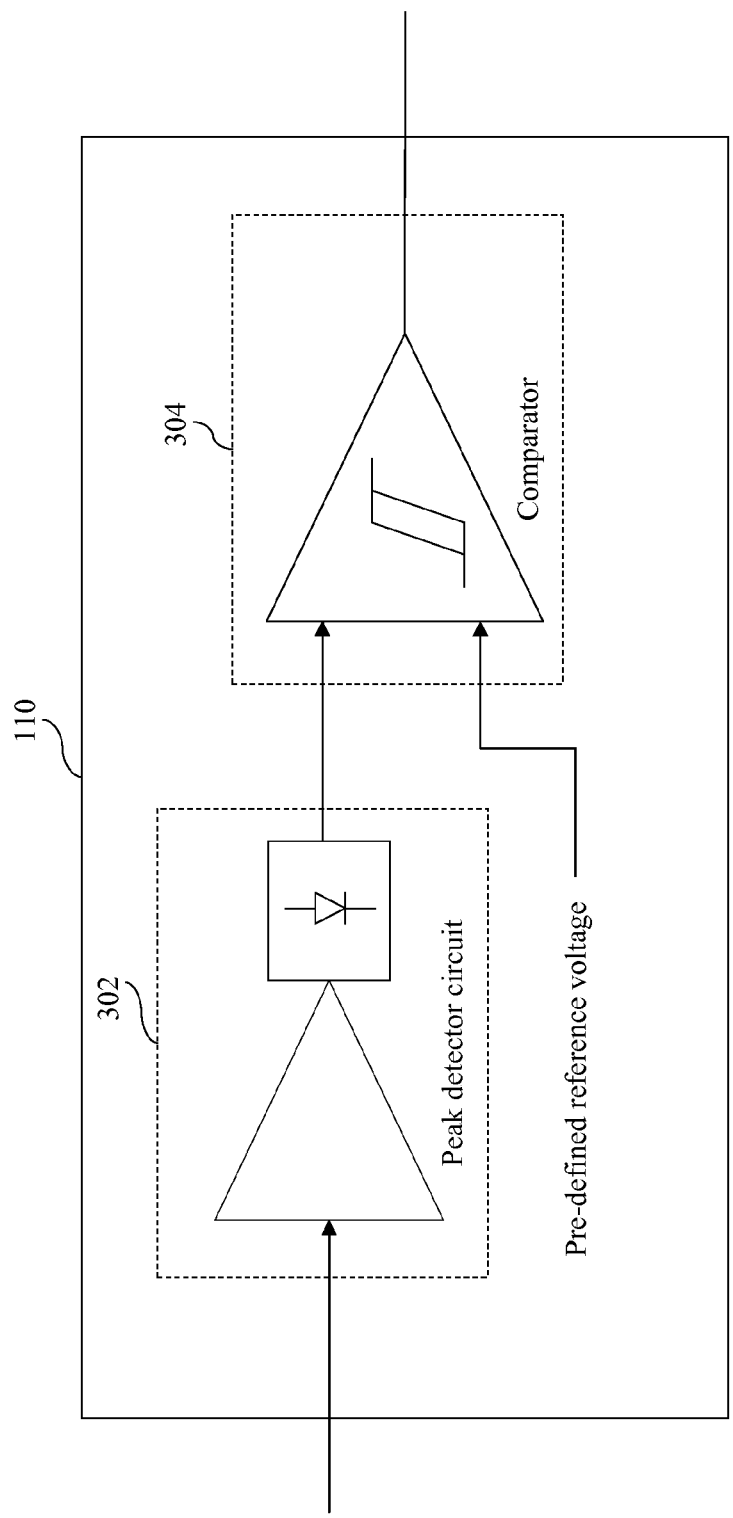
FIG. 3 schematically shows an example of an RF power monitor.

FIG. 3 schematically shows an example of an RF power monitor such as RF power monitor 110a, RF power monitor 110b and RF power monitor 110c. The RF power monitor includes a peak detector 302 followed by a comparator 304.

Peak detector 302 generates an alarm, indicating a low RF power condition. Peak detector 302 detects the amplitude of the RF signal. Comparator 304 compares the detected amplitude of the RF signal with a pre-defined reference voltage, and generates the alarm signal if the amplitude of the RF signal is below the pre-defined reference voltage.

It is understood to a person having ordinary skill in the art that the RF power monitor may include one or more comparators.

According to an embodiment of the present invention, the one or more predefined voltages may be an upper reference voltage and a lower reference voltage. It is also understood to a person having ordinary skill in the art that the value of the upper reference voltage and the lower reference voltage may be different for the one or more RF power monitors such as RF power monitor 110a, RF power monitor 110b and RF power monitor 110c.

Figure 4:
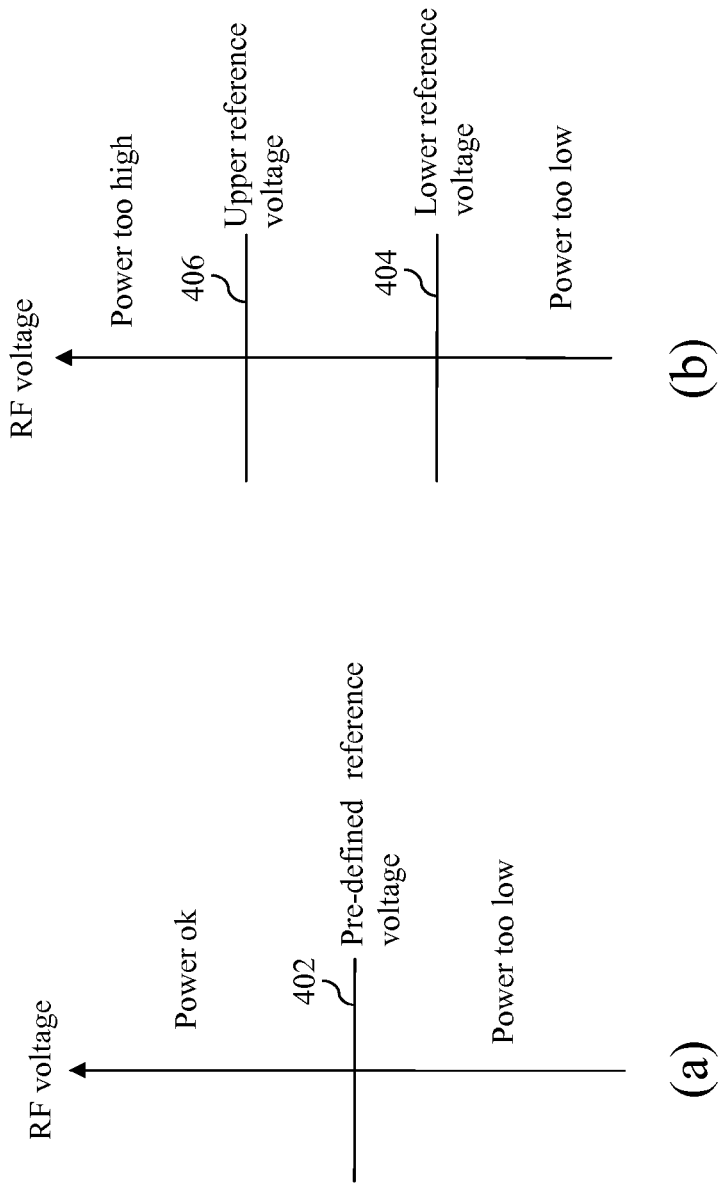
FIG. 4(a) schematically shows pre-defined reference voltage, according to an example of an embodiment of the invention.
FIG. 4(b) schematically shows pre-defined reference voltages, according to an example of another embodiment of the invention.

FIG. 4(a) schematically shows an example of a pre-defined reference voltage. RF power monitor 110 includes a single comparator with a pre-defined reference voltage 402 applied to one input terminal. Another input terminal of the comparator is connected to the output terminal of peak detector 302.

When the output of peak detector 302 becomes less than pre-defined reference 402, an RF power monitor such as RF power monitor 110 generates a "power too low" alarm signal. Control unit 112 receives the alarm signal and modifies the one or more operating parameters of RF signal-generation unit 102 and/or power amplifier 104.

FIG. 4(b) schematically shows another example of pre-defined reference voltages. RF power monitor 110 includes two comparators. A lower reference voltage 404 is applied to an input terminal of a first comparator. The other input terminal of the first comparator is connected to the output of peak detector 302. An Upper reference voltage 406 is applied to an input terminal of a second comparator. The other input terminal of the second comparator is connected to the output of peak detector 302.

When the voltage amplitude of the RF signal at the input of an RF power monitor such as RF power monitor 110 becomes less than lower reference voltage 404, RF power monitor 110 generates a "power too low" alarm signal. Similarly, when the voltage amplitude of the RF signal at the input of RF power monitor 110 becomes greater than upper reference voltage 406, RF power monitor 110 generates a "power too high" alarm signal. Based on the alarm signal generated by RF power monitor 110, control unit 112 modifies one or more operating parameters of RF signal-generation unit 102 and/or power amplifier 104.

Figure 5:
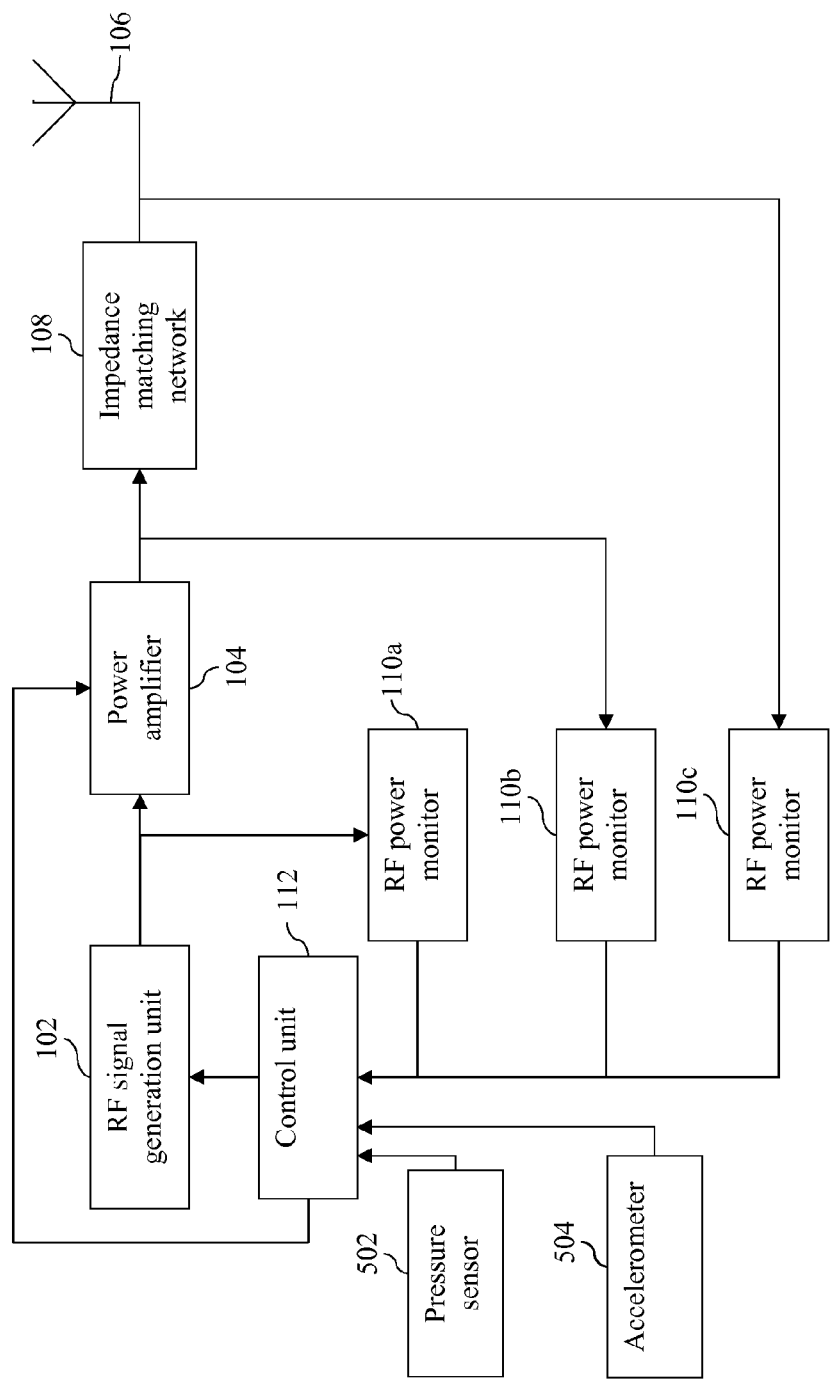
FIG. 5 schematically shows an example of a short-range communication unit.

FIG. 5 schematically shows an example of a short-range communication unit. The short-range communication unit may be employed in a vehicle. The short-range communication unit monitors the pressure and acceleration of one or more tires of the vehicle and transmits information about the pressure and acceleration to a receiver in the vehicle.

The short-range communication unit includes a pressure sensor 502, an accelerometer 504, RF signal-generation unit 102, power amplifier 104, antenna 106, impedance-matching-network 108, one or more RF power monitors, such as RF power monitor 110a, RF power monitor 110b and RF power monitor 110c, and control unit 112 such as a microcontroller.

Power amplifier 104 is connected to the output of RF signal-generation unit 102. Impedance-matching network 108 is connected between power amplifier 104 and antenna 106. The input of RF power monitor 110a is connected to the output of RF signal-generation unit 102. The input of RF power monitor 110b is connected to the output of power amplifier 104. The input of RF power monitor 110c is connected to the output of impedance-matching network 108. The outputs of the RF power monitors (110a, 110b and 110c) are connected to control unit 112. Further, control unit 112 is connected to RF signal-generation unit 102 and power amplifier 104. One or more pressure sensors such as pressure sensor 502 are employed in one or more tires of the vehicle. The output of pressure sensor 502 is connected to control unit 112. One or more accelerometers such as accelerometer 504 are employed in one or more tires of the vehicle. The output of accelerometer 504 is connected to control unit 112.

Pressure sensor 502 measures the air pressure inside the tire of the vehicle and sends the pressure information to control unit 112. Accelerometer 504 measures the acceleration and sends the measured acceleration information to control unit 112. Control unit 112 generates a telegram based on the measured pressure information and the measured acceleration information. Based on the telegram, RF signal-generation unit 102 generates an RF signal. Power amplifier 104 amplifies the RF signal. Impedance-matching network matches the output impedance of power amplifier 104 to input impedance of antenna 106. Antenna 106 radiates the amplified RF signal. The RF signal radiated by antenna 106 is received by the receiver located in the vehicle. The receiver extracts the at least one of the measured pressure and the measured acceleration information from the received RF signal and displays the pressure and acceleration value on a display screen located on a dashboard of the vehicle.

A failure or a malfunction of at least one of RF signal-generation unit 102, power amplifier 104 and impedance-matching network 108 leads to undesired variations in the voltage amplitude of the RF signal at each stage. For example, the voltage amplitude of the RF signal may become greater than upper reference voltage 406 or less than lower reference voltage 404, which is not desired. One or more RF power monitors such as RF power monitor 110a, RF power monitor 110b and RF power monitor 110c continuously monitor the voltage amplitudes of the RF signal at the output of RF signal-generation unit 102, power amplifier 104 and impedance-matching network 108, respectively. When the voltage amplitude of the RF signal becomes less than the lower reference voltage, a "power too low" alarm signal is generated by the RF power monitor such as RF power monitor 110a, RF power monitor 110b and RF power monitor 110c. When the voltage amplitude of the RF signal becomes greater than the upper reference voltage, a "power too high" alarm signal is generated by the RF power monitor such as RF power monitor 110a, RF power monitor 110b and RF power monitor 110c. Subsequently, control unit 112 modifies one or more operating parameters of at least one of RF signal-generation unit 102 and power amplifier 104 based on the alarm signal, to stabilize the amplitude of the RF signal.

The system described above has a number of advantages over the prior art. Various embodiments of the invention provide a system for monitoring and controlling the power of the RF signal in a short-range transmitter. The system ensures proper transmission of the RF signal. A failure or malfunctioning of the RF signal-generation unit, the power amplifier and the impedance-matching network is detected and corrective action is taken by the control unit. Control unit 112 is continuously receives feedback regarding the voltage amplitude of the RF signal at the output of the RF signal-generation unit, the power amplifier and the impedance-matching network and correspondingly modifies the operating parameters to stabilize the RF signal.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A system for monitoring and controlling the power of a Radio Frequency (RF) signal in a short range RF transmitter, said RF transmitter comprising an RF signal generation unit for generating the RF signal, a power amplifier for amplifying the RF signal, and an antenna for radiating the amplified RF signal, said system comprising:
   an RF power monitoring unit for connecting to an output stage of at least one component of the transmitter, for monitoring a power of the RF signal and generating at least one alarm signal indicating a faulty condition when said power meets a predetermined alarm criterion revealing a failure of at least one of said RF signal-generation unit, said power amplifier and impedance-matching network; and
   a control unit connected with an input to said RF power monitoring unit and for connecting to an output to a control input of at least one component of said transmitter for modifying at least one operating parameter of at least one of the RF signal generation unit and the power amplifier in response to said alarm signal, wherein said control unit is arranged to restart a telegram transmission of said RF signal after modifying said operating parameter.

2. The system as claimed in claim 1, wherein the RF signal generation unit comprises:
   a local oscillator for generating the RF signal; and
   a synthesizer for varying a frequency of the RF signal and wherein said control unit for connecting to said synthesizer.

3. The system as claimed in claim 2, wherein said operating parameter comprises at least one of biasing conditions of the power amplifier, gain of the power amplifier, a frequency of the RF signal and an amplitude of the RF signal.

4. The system as claimed in claim 2, wherein said transmitter includes an impedance matching network connected between the power amplifier and the antenna for matching output impedance of the power amplifier to input impedance of the antenna.

5. The system as claimed in claim 2, wherein said RF power monitoring unit comprises:

a peak detector circuit for measuring an amplitude of the RF signal at said output stage; and a comparator for comparing said amplitude with at least one reference level and generating said alarm signal based on said comparison.

6. The system as claimed in claim 1, wherein said operating parameter comprises at least one of biasing conditions of the power amplifier, gain of the power amplifier, a frequency of the RF signal and an amplitude of the RF signal.

7. The system as claimed in claim 1, wherein said transmitter includes an impedance matching network connected between the power amplifier and the antenna for matching output impedance of the power amplifier to input impedance of the antenna.

8. The system as claimed in claim 1, wherein said RF power monitoring unit comprises:

a peak detector circuit for measuring an amplitude of the RF signal at said output stage; and a comparator for comparing said amplitude with at least one reference level and generating said alarm signal based on said comparison.

9. The system as claimed in claim 1, comprising a first comparator for comparing an amplitude with a lower reference level and generating a power too low signal when said amplitude comes below said lower reference level.

10. The system as claimed in claim 9, wherein said RF power monitoring unit comprises a second comparator for comparing said amplitude with an upper reference level higher than said lower reference level and generating a power too high alarm signal when said amplitude exceeds said first reference level.

11. The system as claimed in claim 9, wherein said control unit is arranged to modify at least one parameter to reduce said power of said RF signal in response said power too high signal and/or to modify the parameter to increase said power of said RF signal in response said power too low signal.

12. A short range communication unit, comprising:
a source of data signals;
a transmitter connected to said source of data, said RF transmitter comprising: an RF signal generation unit for generating the RF signal based on said data signals; a power amplifier for amplifying the RF signal; and an antenna for radiating the amplified RF signal; and an RF power monitoring unit connected to an output stage of at least one component of the transmitter, for monitoring a power of the RF signal and generating at least one alarm signal indicating a faulty condition when said power meets a predetermined alarm criterion revealing a failure of at least one of said RF signal-generation unit, said power amplifier and impedance-matching network; and a control unit connected with an input to said RF power monitoring unit and with an output to a control input of at least one component of said transmitter for modifying at least one operating parameter of at least one of the RF signal generation unit and the power amplifier in response to said alarm signal, wherein said control unit is arranged to restart a telegram transmission of said RF signal after modifying said operating parameter.

13. The unit as claimed in claim 12, wherein said source of data signals comprises:

a pressure sensor for measuring the pressure of at least one tire of a vehicle; and a microcontroller for generating a telegram using said data signal based on the measured pressure.

14. The unit as claimed in claim 12, comprising an accelerometer for measuring the acceleration of the at least one tire of a vehicle.

15. The unit as claimed in claim 14, comprising a microcontroller arranged to generate a telegram using data signals based on the measured acceleration.

16. A communication system including a communication unit as claimed in claim 12 and a receiving unit positioned within said short range from said communication unit, for receiving said RF signal and extracting said data signals from said RF signal.

17. A communication system including a communication unit as claimed in claim 13 and a receiving unit positioned within said short range from said communication unit, for receiving said RF signal and extracting said data signals from said RF signal.

18. A communication system including a communication unit as claimed in claim 15 and a receiving unit positioned within said short range from said communication unit, for receiving said RF signal and extracting said data signals from said RF signal.

* * * * *